United States Patent [19]

Knietzsch et al.

[11] Patent Number: 4,768,461

[45] Date of Patent: Sep. 6, 1988

[54] INDICATING DEVICE

[75] Inventors: Hans-Dieter Knietzsch, Bad Homburg; Gerhard Wesner, Oberursel, both of Fed. Rep. of Germany

[73] Assignee: VDO Adolf Schindling AG, Frankfurt am Main, Fed. Rep. of Germany

[21] Appl. No.: 82,772

[22] Filed: Aug. 5, 1987

[30] Foreign Application Priority Data

Aug. 22, 1986 [DE] Fed. Rep. of Germany ....... 3628539

[51] Int. Cl.$^4$ ............................................. G01D 13/22
[52] U.S. Cl. .................................... 116/328; 116/288; 116/DIG. 6; 403/248
[58] Field of Search ................. 116/327–332, 116/284–293, DIG. 6, DIG. 36; 362/23, 26; 368/228–238; 403/248, 255, 261, 264; 441/40, 41, 43, 45, 57, 60, 339, 501, 508–510

[56] References Cited

U.S. PATENT DOCUMENTS

| 892,021 | 6/1908 | Wirsching | 116/328 |
| 2,410,064 | 10/1946 | Hardesty | 116/DIG. 36 |
| 2,715,886 | 8/1955 | Smith | 116/288 |
| 2,916,011 | 12/1959 | Molis | 116/DIG. 36 |
| 3,659,320 | 5/1972 | Meyer | 411/509 |

Primary Examiner—William A. Cuchlinski, Jr.
Assistant Examiner—W. Morris Worth
Attorney, Agent, or Firm—Martin A. Farber

[57] ABSTRACT

A support (2) which serves for fastening a pointer (1) on a pointer shaft has, towards the top, a holding part (12) which is developed as an expansion rivet. The pointer (1) has a central passage (13) through which the holding part (12) engages. A cap (3) is provided with an expansion pin (14) which is adapted to be pushed from above into the holding part (12) when the cap (3) is mounted. In this way, the expansion rivet is expanded and the pointer (1) is thereby attached firmly to the support (2). A projection (16) on the holding part (12) which engages into a recess (17) in the pointer (1) determines the exact angular position of the pointer (1) with respect to the holding part (12).

11 Claims, 2 Drawing Sheets

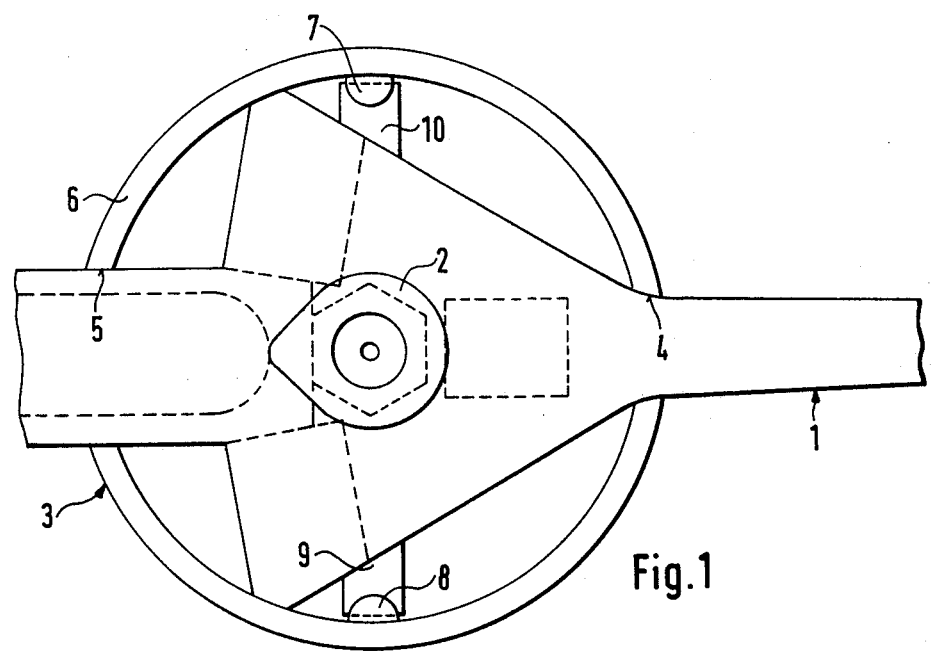
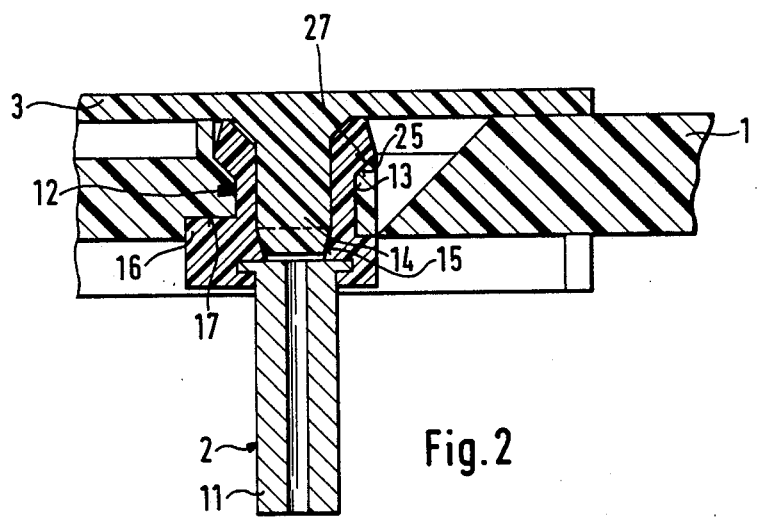
Fig.1
Fig.2 ial and fastened on a support which is pushed over a pointer shaft, is formed of a hub body and a holding part, and is covered by a cap, the indicating device having a measurement mechanism on the other side of the dial and the pointer being detachably fastened to the support in a predetermined alignment by a form-locked connection.

INDICATING DEVICE

FIELD AND BACKGROUND OF THE INVENTION

The present invention relates to an indicating device.

An indicating device has a pointer arranged on one side of a dial and fastened on a support which is pushed over a pointer shaft, is formed of a hub body and a holding part, and is covered by a cap, the indicating device having a measurement mechanism on the other side of the dial and the pointer being detachably fastened to the support in a predetermined alignment by a form-locked connection.

The known indicating device makes it possible to mount the support with the pointer on the dial of the measurement mechanism and then calibrate it. The pointer can then be removed, the pointer shaft, together with the support, pushed through the opening in the dial and the pointer then again introduced into the support in the original alignment. By this development a substantially smaller opening in the dial is sufficient than in the case of indicating devices in which the pointer which is mounted on the pointer shaft must be passed through the opening in the dial.

In the known indicating device, the pointer is held in the cap. The cap, on its part, is locked to the support in a predetermined position. The known indicating device has the disadvantage that the length of the support must correspond approximately to the diameter of the cap so that the cap can lock on the support. This, in its turn, means a relatively large opening in the dial so that the support can be passed through it. In the case of pointers illuminated by flooding light a large opening means a loss of light. Aside from this, the known indicating device is of relatively complicated construction and therefore not yet optimal for mass production.

It is an object of the invention to develop an indicating device of the aforementioned type as simply as possible in the manner that its pointer can be removed from the measurement mechanism after the latter has already been calibrated and then mounted again in correct position, and that only the smallest possible opening in the dial is necessary for the passage of the pointer shaft together with the support.

SUMMARY OF THE INVENTION

According to the invention, the holding part (12) is developed as an expansion rivet which engages into the passage (13) in the pointer (1), and the cap (3) has an expansion pin (14) which engages into the expansion rivet.

By this development the indicating device of the invention is substantially simplified as compared with the previously known device, without the possibility of the remounting of the pointer in the proper position being lost. The attachment of the pointer by means of the expansion rivet is very simple since the expansion rivet is expanded by the placing-on of the cap. The diameter of the expansion rivet can be very slight so that only a correspondingly small opening is required in the dial also. As a result, the losses of light by emerging scattered light are slight. Furthermore, there is sufficient room available for a roughly dimensioned light coupling place on the pointer.

Upon the calibration of the measuring mechanism before the mounting of the cap, the pointer is held on the expansion rivet if, in accordance with one advantageous development of the invention, the expansion arms (18–21) of the holding part (12) at their free end have a thickening (22, 23) which snaps over the pointer (1) which has been placed thereon.

The pointer can very easily be pushed on the expansion rivet and, after the calibration, again removed from it if, in accordance with another feature of the invention, the thickening (22, 23) in each case has an upward facing first bevel (24) which serves for the pushing-on of the pointer (1) and a second bevel (25) which faces downward and can be placed on a conical resting surface (27) of the pointer (1).

The exact angular position of the pointer relative to the holding part can be established very easily if the holding part (12) has a radially aligned projection (16) which engages in a corresponding cutout (17) in the pointer.

It is also advantageous if the hub body (11) has a top flange (28) which is not of rotational symmetry and over which the holding part (12) is snapped. By this development the holding part and the hub body may consist of different materials. Furthermore, the manufacture is very simple and thus inexpensive.

The cap is held in very simple manner on the pointer and with its expansion pin in the holding part if the cap (3) is locked by detent in its mounted position to the pointer (1).

The detent means are of particularly simple development if projections (7, 8) are provided internally on the edge (6) of the cap (3) which grips over the pointer (1) and if the pointer (1) has corresponding outwardly directly arms (9, 10) over which the projections (7, 8) are capable of gripping when the cap (3) is mounted.

For the removal of the cap it is advantageous if the cap (3) has two projections (7, 8) which are arranged in each case 90° from their edge cutouts (4, 5) for the passage of the pointer (1). For the removal of the cap, the cap can in such an embodiment be bent upward on the two sides having the projections, thereby effecting disengagement.

The inserting of the expansion pin into the holding part is particularly simple if the expansion pin (14) of the cap (3) is substantially cylindrical and has a conical bevel (13) on its free end.

It also contributes to simplifying the mounting of the cap and thus the insertion of the expansion pin if the edge thickening (22, 23) has an inward-directed pull-in bevel (26).

The invention permits of numerous embodiments.

BRIEF DESCRIPTION OF THE DRAWINGS

With the above and other objects and advantages in view, the present invention will become more clearly understood in connection with the detailed description of preferred embodiments, when considered with the accompanying drawings, of which:

FIG. 1 is a view from below of a pointer with its support of a display device;

FIG. 2 is a vertical section through the arrangement of FIG. 1;

DETAILED DESCRIPTION OF THE PREFERRED EMBODIMENT

Figure 3:
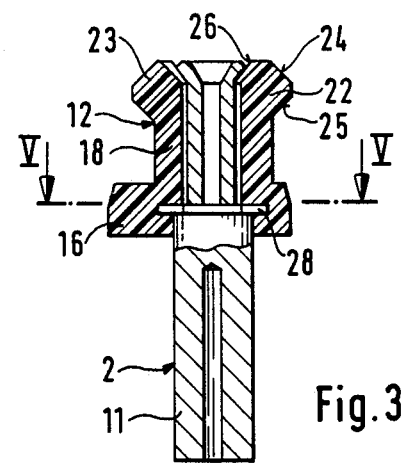
FIG. 3 is a vertical section through the support according to FIGS. 1 and 2.

FIG. 1 shows a pointer 1 which is fastened on a support 2 which, in its turn, is adapted to be pushed in customary manner over a pointer shaft (not shown) of a measurement mechanism. A cap 5 is pushed from above over the central part of the pointer 1, the cap having on opposite sides edge cutouts 4, 5 through which the pointer 1 extends out of the cap 3.

The cap 3 has a rim 6 which is directed downward in customary manner and has on the inside, 90° from the edge cutouts 4, 5, corresponding inward-directed projections 7, 8 respectively. These projections 7, 8 engage over outwardly facing arms 9, 10 of the pointer 1 so that the cap 3 is locked to the pointer 1.

The manner of attachment of the pointer 1 to the support 2 can be noted from FIG. 2. It shows that the support 2 comprises a hub member 11 and a holding part 12 developed as expansion rivet. The pointer 1 has a passage 13 through which the holding part 12 engages. Into this holding part 12 there extends an expansion pin 14 which is developed integral with the cap 3 and expands the holding part 12 so that the pointer 1 is seated firmly on it. In order to facilitate the insertion of the expansion pin 14, the latter is provided with a conical bevel 15 at its lower end. The exact angular position of the pointer 1 relative to the holding part 12 is secured by a radially outwardly-directed projection 16 on the foot of the holding part 12, the projection engaging in a corresponding cutout 17 in the pointer 1.

Figure 4:
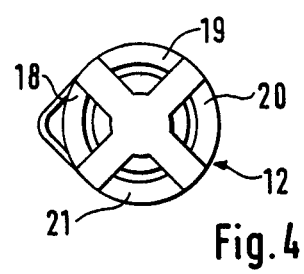
FIG. 4 is a top view of the support.
Figure 5:
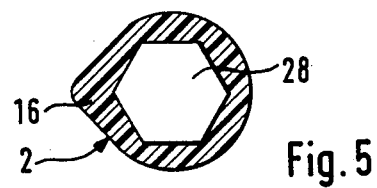
FIG. 5 is a horizontal section along the line V—V through the support of FIG. 3.

For further explanation of the development of the support 2, reference is now had to FIGS. 3, 4 and 5. FIG. 4, viewed in conjunction with FIG. 3, shows that the holding part 12 is slit in X shape from above in order to form an expansion rivet, so that four expansion arms 18-21 are produced. As can be noted from FIG. 3, each of them has at its upper end a thickening 22, 23 which is limited at the top by an outwardly descending first bevel 24 and towards the bottom by a second bevel 25. Towards the inside, each of the thickenings 22, 23 has a draw-in bevel 26 in order to facilitate the pushing-in of the expansion pin 14. The second bevel 25 is so dimensioned that, with the pointer 1 mounted, it can place itself on a conical resting surface 27 of the pointer 1 positioned in FIG. 2 and thereby holds the latter down.

As can be noted from FIGS. 3 and 5, the hub member 11 is provided on its upper end with an outwardly directed flange 28 which is hexagonal in this embodiment and around which the holding part 12 is expanded.

For the calibrating of a measurement mechanism the latter is acted on by a constant control current and the support is then placed on in the correct angular position with pointer 1 placed on the holding part 12, but the cap 3 being still left off. The pointer 1 is then pulled off from the holding part 12, which is readily possible without a tool because of the conical resting surface 27. The pointer shaft (not shown) is then pushed, together with the support 2 seated on it, through the corresponding opening of a dial and the pointer 1 and the cap 3 are then mounted. The projection 16 provides assurance that the original angular position of the pointer is reproduced.

We claim:

1. In an indicating device having a pointer, a pointer shaft, a support including a hub body and a holding part for connecting the pointer to the shaft, a cap, a measurement mechanism, and a dial located between the pointer and the measurement mechanism, the pointer being arranged on one side of a dial and fastened on the support, the support being pushed over the pointer shaft, the support being covered by the cap, and the pointer being detachably fastened to the support in a predetermined alignment and having a physical shape to provide a form-locked connection with the support, the improvement wherein the pointer has a passage for receipt of an expansion rivet, the holding part is developed as an expansion rivet which engages into the passage in the pointer, and the cap has an expansion pin which engages into the expansion rivet.

2. An indicating device according to claim 1, wherein the holding part has expansion arms which have at their free end a thickening, said thickening snapping over the pointer during a placement of the pointer on the holding part.

3. An indicating device according to claim 2, wherein said pointer has a conical resting surface, and said thickening in each case has an upward facing first bevel which serves for pushing-on the pointer and a second bevel which faces downwardly and is placable on the conical resting surface of the pointer.

4. An indicating device according to claim 1, wherein said holding part has a radially aligned projection, and said pointer has a corresponding cutout, said projection of said holding part being engageable in the cutout in the pointer.

5. An indicating device according to claim 1, wherein said hub body has on its top a flange which is of non-rotational symmetry, and the holding part is snapped over said flange.

6. An indicating device according to claim 1, wherein said cap is locked by detent in its mounted position to the pointer.

7. An indicating device according to claim 1, wherein the cap includes projections provided internally on the edge of the cap for gripping the pointer; and the pointer includes outwardly directly arms, said projections engaging with said arms for gripping the cap.

8. An indicating device according to claim 7, wherein said cap comprises edge cutouts for passage of the pointer, and the two projections of the cap are arranged 90° from the edge cutouts for the passage of the pointer.

9. An indicating device according to claim 1, wherein said expansion pin of the cap is substantially cylindrical and has a conical bevel on its free end.

10. An indicating device according to claim 2, wherein said thickening has an inward-directed pull-in bevel.

11. An indicating device according to claim 3, wherein said thickening has an inward-directed pull-in bevel.

* * * * *